United States Patent [19]
Takenaka

[11] Patent Number: 6,128,246
[45] Date of Patent: Oct. 3, 2000

[54] SEMICONDUCTOR MEMORY DEVICE HAVING WRITE RECOVERY CIRCUIT STRUCTURE

[75] Inventor: Tetsuro Takenaka, Miyazaki, Japan

[73] Assignee: Oki Electronic Industry Co., LTD, Tokyo, Japan

[21] Appl. No.: 09/385,140

[22] Filed: Aug. 31, 1999

[30] Foreign Application Priority Data

Sep. 18, 1998 [JP] Japan .................................. 10-264522

[51] Int. Cl.$^7$ .................................................. G11C 8/00
[52] U.S. Cl. ..................................... 365/230.06; 365/203
[58] Field of Search .............................. 365/230.06, 203; 326/105, 106

[56] References Cited

U.S. PATENT DOCUMENTS 5,777,935  7/1998  Pantelakis et al. .
5,970,018  10/1999  Iwata et al. ........................ 365/230.06

*Primary Examiner*—Huan Hoang
*Attorney, Agent, or Firm*—Jones Volentine, LLC

[57] ABSTRACT

A semiconductor memory device includes word lines, bit lines, and memory cells. Each of the memory cells is coupled to a corresponding one of the word lines and a corresponding one of the bit lines. The semiconductor memory device also includes a first node supplied with a first voltage level, a second node supplied with a second voltage level, a third node, and decoders. Each of the decoders is coupled among the second node, the third node, and a corresponding one of the word lines and also selectively couples either one of the second node and the third node to the corresponding word line in response to an address signal. The semiconductor memory device further includes a first voltage signal supply circuit, coupled to the first node and the third node, which couples the first node to the third node according to a control signal, and a second voltage signal supply circuit, coupled to the second node and the word lines, which couples the second node to the word lines according to the control signal.

11 Claims, 12 Drawing Sheets

SEMICONDUCTOR MEMORY DEVICE HAVING WRITE RECOVERY CIRCUIT STRUCTURE

BACKGROUND OF THE INVENTION

1. Field of the Invention

The present invention generally relates to a semiconductor memory device, and more particularly, to a Static Random Access Memory having a write recovery circuit structure.

This application relies for priority on Japanese patent application, Serial Number 264522/1998, filed Sep. 18, 1998, which is incorporated herein by reference in its entirety.

2. Description of the Related Art

A static random access memory (hereinafter SRAM) is used as, for example, a cache memory for a computer or the like. In such SRAM, a write recovery period is needed for stabilizing a data read operation. The write recovery period is generally known as a time period at the end of a write cycle in preparation for a succeeding read cycle. On the other hand, if the write recovery period becomes long, an operation speed of the SRAM decreases. Therefore, the write recovery period must be reduced.

There is a conventional technique for reducing the write recovery period. That is, a transistor which connects a bit line to a complimentary bit line at the end of the write cycle is provided. This transistor is known as an equalize transistor. Furthermore, transistors which supply a predetermined voltage level, e.g., a power supply voltage, to the bit line and the complimentary bit line at the end of the write cycle are provided. These transistors are known as pre-charge transistors.

However, since there is a demand for higher computer operation speeds, the operation speed of the SRAM must be even further decreased. Therefore, an improved semiconductor memory device, having a short write recovery period, has been needed in this technical field.

SUMMARY OF THE INVENTION

It is an object of the present invention to provide a semiconductor memory device that may reduce a write recovery time period.

It is another object of the present invention to provide a semiconductor memory device that may prevent a malfunction when a data read cycle occurs after a data write cycle.

According to one aspect of the present invention, for achieving one or more of the above objects, there is provided a semiconductor memory device which includes word lines, bit lines, and memory cells. Each of the memory cells is coupled to a corresponding one of the word lines and a corresponding one of the bit lines. The semiconductor memory device also includes a first node supplied with a first voltage level, a second node supplied with a second voltage level, a third node, and decoders. Each of the decoders is coupled among the second node, the third node, and a corresponding one of the word lines and also selectively couples either one of the second node and the third node to the corresponding word line in response to an address signal. The semiconductor memory device further includes a first voltage signal supply circuit, coupled to the first node and the third node, which couples the first node to the third node according to a control signal and a second voltage signal supply circuit, coupled to the second node and the word lines, which couples the second node to the word lines according to the control signal.

The above and further objects and novel features of the invention will more fully appear from the following detailed description, appended claims, and the accompanying drawings.

DETAILED DESCRIPTION OF THE PREFERRED EMBODIMENTS

Figure 1:
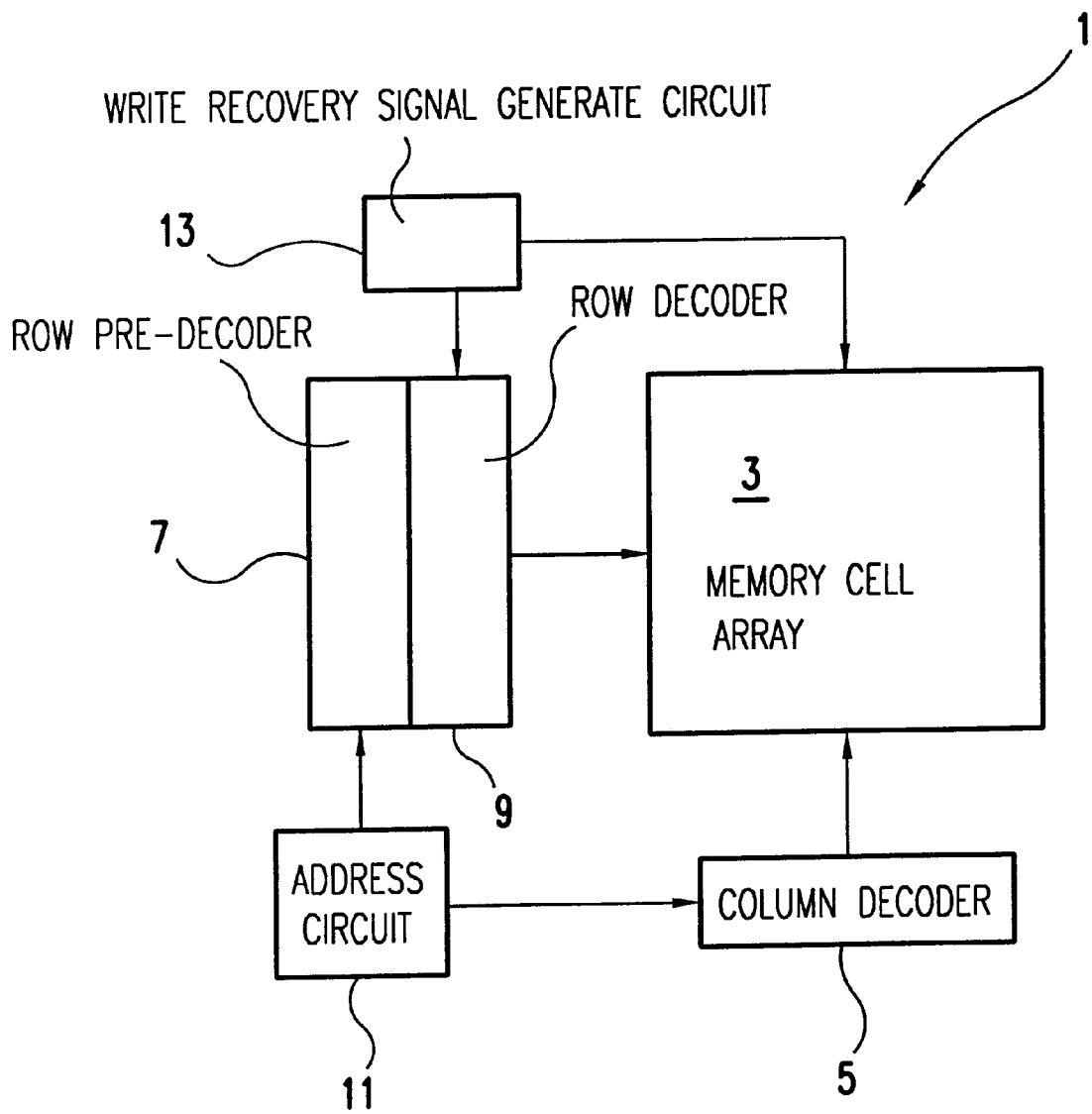
FIG. 1 is a schematic diagram showing a semiconductor memory device according to a first preferred embodiment of the present invention.

A semiconductor memory device according to the present invention will be explained hereinafter with reference to figures. In order to simple explanations, like elements are given like or corresponding reference numerals throughout this specification and figures. Thus, dual explanations of the same elements are avoided.

A semiconductor memory device according to a first preferred embodiment of the present, invention will be explained hereinafter with reference to FIG. 1 through FIG. 6.

FIG. 1 is a schematic diagram showing a semiconductor memory device according to the first preferred embodiment of the present invention. A SRAM 1 is shown in FIG. 1 as an example of the present invention.

As shown in FIG. 1, the SRAM 1 includes a memory cell array 3 which has a plurality of memory cells arranged in a matrix form, a column decoder 5 which controls bit line pairs BL, /BL, a row pre-decoder 7 which controls word lines WL, a row decoder 9, an address circuit 11 which produces an internal address signal, and a write recovery signal generate circuit 13 which generates a write recovery signal /φWE.

Figure 2:
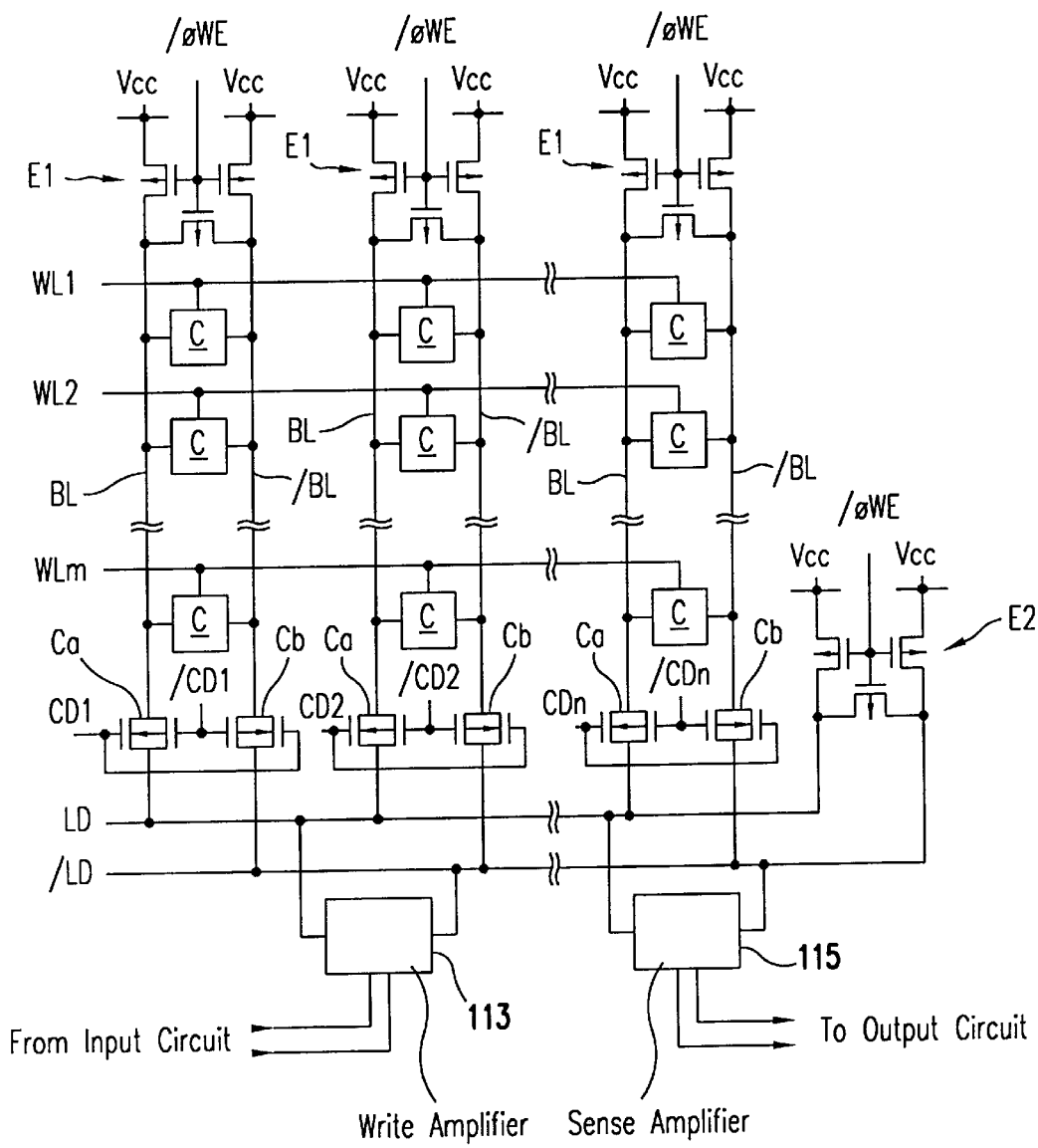
FIG. 2 is a circuit diagram showing a memory cell array 3 of FIG. 1.

FIG. 2 is a circuit diagram showing the memory cell array 3.

As shown in FIG. 2, each of the bit line pairs BL, /BL is coupled to a common data bus line pair LD, /LD through corresponding one of column switch pairs Ca, Cb. The common data bus line pair LD, /LD is connected to a write amplifier 113 and a sense amplifier 115.

The write amplifier 113 changes voltage levels of the common data bus line pairs LD, /LD according to an input data from an input circuit (not shown in FIG. 2) when an enable signal /WE is at an L level. (That is, at a time when a data writing operation for writing a predetermined data into the SRAM is executed.)

On the other hand, in the case that a data stored in the memory cell C is read out, the sense amplifier 115 outputs changes of voltage levels, which correspond to a data read from the memory cell C, on the common data bus line pairs LD, /LD to an output circuit (not shown in FIG. 2).

Each of the column switch pairs Ca, Cb is a transfer gate comprised of a p-channel type MOS transistor (hereinafter PMOS) and an n-channel type MOS transistor (hereinafter NMOS). Gate terminals of these transistors are connected to the column decoder 5.

Column select signals CD1, /CD1 through CDn, /CDn are inputted to corresponding ones of the column switch pairs Ca, Cb and thus only one of the column switch pairs Ca, Cb is selected and enters an ON state.

When the SRAM is in a write cycle, one of the bit line pairs BL, /BL which corresponds to the selected one of column switch pair Ca, Cb is electrically connected to the common data bus line pair LD, /LD, whereby a voltage level on the common data bus line pair LD, /LD is transferred to the one of the bit line pairs BL, /BL. Thereafter, one of the word lines WL1 through WLm is selected by the row decoder 9. The memory cell C which corresponds to the selected word line WL is determined and an input data is written into the determined memory cell C.

Each of reset circuits E1 are connected between a power supply VOC (e.g., a higher power supply voltage) and corresponding one of bit line pairs BL, /BL. The reset circuits E1 apply the power supply voltage VOC to the bit line pairs BL, /BL (i.e., the operation is called pre-charging).

Each of the reset circuits E1 is made up of a plurality of PMOSs. Each of the PMOSs has a gate which receives the write recovery signal /φWE.

A reset circuit E2 is connected between the power supply VCC and the common data bus line pairs LD, /LD. The reset circuit E2 applies the power supply voltage VCC to the common data bus line pairs LD, /LD. (i.e., the operation is called pre-charging).

The reset circuit E2 is made up of a plurality of PMOSs. Each of the PMOSs has a gate which receives the write recovery signal /φWE.

The write recovery signal /φWE goes to the L level and is maintained at the L level in a predetermined period when a write enable signal /WE changes from the L level to an H level.

Figure 3:
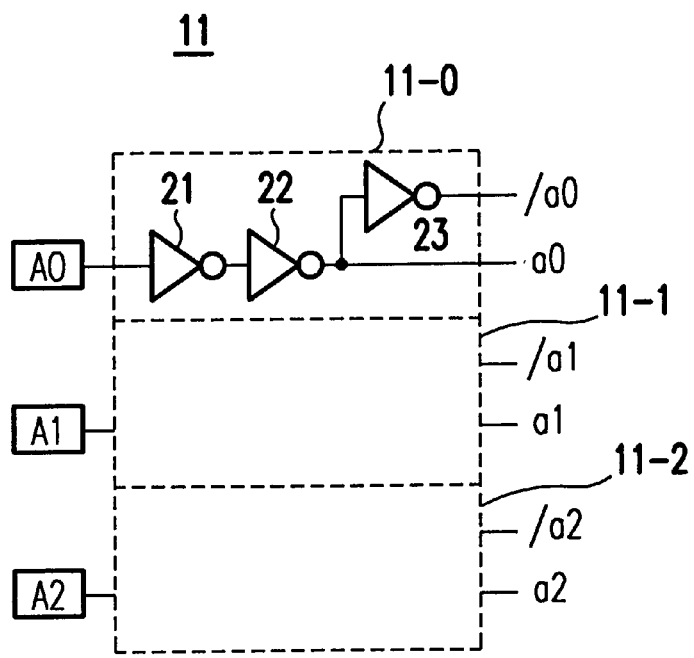
FIG. 3 is a circuit diagram showing an address circuit according to a first preferred embodiment of the present invention.

FIG. 3 is a circuit diagram showing the address circuit 11 according to the first preferred embodiment of the present invention.

In order to simplify explanations, an address signal received from an external device is explained as 3 bits (i.e., address bits A0, A1, A2).

As shown in FIG. 3, the address circuit 11 is made up of sub address circuits 11-0 11-1, and 11-2 which correspond to the address bit A0, the address bit A1, and the address bit A2, respectively.

Since the structures of the sub address circuits 11-1 and 11-2 are identical to the sub address circuit 11-0, they are not shown in FIG. 3.

Each of the sub address circuits 11-0, 11-1, and 11-2 has inverter gates 21, 22, and 23. The address signal received from the external device is transferred through the inverter gates 21 and 22 which are connected in series. The transferred signal is output as an internal address signal a0. The internal address signal a0 is applied to the inverter gate 23. The inverter gate 23 produces an internal address signal /a0 which is the complement of the internal address signal a0 according to the internal address signal a0.

The sub address circuits 11-1 and 11-2 produce a pair of internal address signal a1, /a1 and a pair of internal address signal a2, /a2, respectively.

These internal address signals (i.e., a0, /a0, a1, /a1, a2, /a2, a3, /a3) produced by the address circuit 11 are applied to the column decoder 5 and the row pre-decoder 7.

Figure 4:
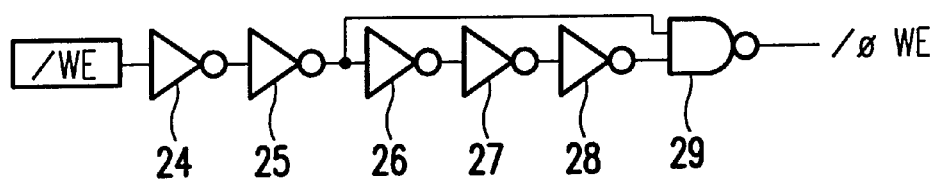
FIG. 4 is a circuit diagram showing a write recovery signal generate circuit according to a first preferred embodiment of the present invention.

FIG. 4 is a circuit diagram showing the write recovery signal generate circuit 13 according to the first preferred embodiment of the present invention.

The write recovery signal generate circuit 13 is made up of a NAND gate 29 and inverters 24, 25, 26, 27, and 28 which are connected in series.

The NAND gate 29 has one input terminal which is connected to an output terminal of the inverter 28, another input terminal which is connected to an output terminal of the inverter 25, and an output terminal which outputs the write recovery signal /φWE.

The write recovery signal generate circuit 13 outputs the write recovery signal /φWE that has the L level in a predetermined time period (i.e., the write recovery signal /φWE is called a one shot pulsed signal) to the memory cell array 3 and the row decoder 9 in response to a rising edge of the write enable signal /WE.

Figure 5:
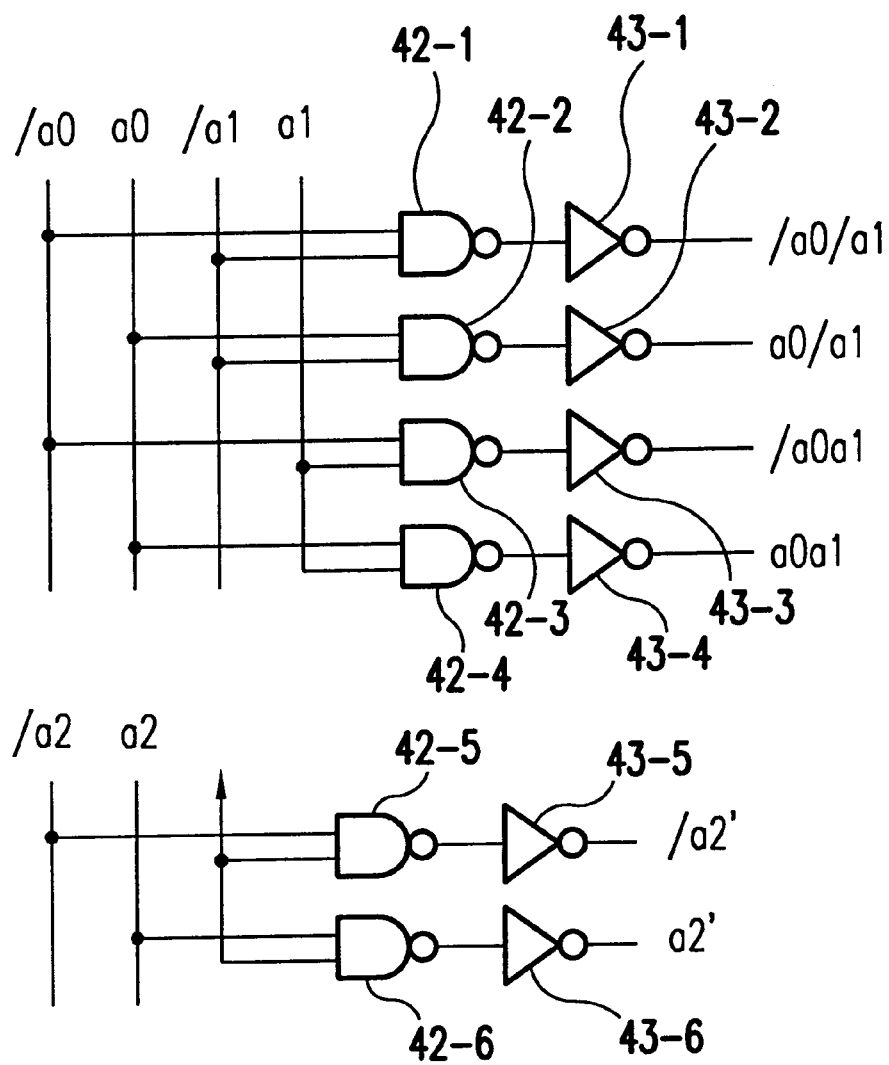
FIG. 5 is a circuit diagram showing a row pre-decoder according to a first preferred embodiment of the present invention.

FIG. 5 is a circuit diagram showing the row pre-decoder 7 according to the first preferred embodiment of the present invention.

The row pre-decoder 7 is comprised of six NAND gates and six inverter gates each of which corresponds to one of the NAND gates.

The internal address signal /a0 is inputted to one input terminal of a NAND gate 42-1. The internal address signal /a1 is inputted to another input terminal of the NAND gate 42-1. An output terminal of the NAND gate 42-1 is connected to an input terminal of an inverter gate 43-1.

The inverter gate 43-1 outputs a signal /a0/a1 which is obtained from an AND operation of the internal address signal /a0 and the internal address signal /a1.

The internal address signal a0 is inputted to one input terminal of a NAND gate 42-2. The internal address signal /a1 is inputted to another input terminal of the NAND gate 42-2. An output terminal of the NAND gate 42-2 is connected to an input terminal of an inverter gate 43-2.

The inverter gate 43-2 outputs a signal a0 /a1 which is obtained from an AND operation of the internal address signal a0 and the internal address signal a1.

The internal address signal /a0 is inputted to one input terminal of a NAND gate 42-3. The internal address signal a1 is inputted to another input terminal of the NAND gate 42-3. An output terminal of the NAND gate 42-3 is connected to an input terminal of an inverter gate 43-3.

The inverter gate 43-3 outputs a signal /a0a1 which is obtained from an AND operation of the internal address signal /a0 and the internal address signal a1.

The internal address signal a0 is inputted to one input terminal of a NAND gate 42-4. The internal address signal a1 is inputted to another input terminal of the NAND gate 42-4. An output terminal of the NAND gate 42-4 is connected to an input terminal of an inverter gate 43-4.

The inverter gate 43-4 outputs a signal a0a1 which is obtained from an AND operation of the internal address signal a0 and the internal address signal a1.

The internal address signal /a2 is inputted to one input terminal of a NAND gate 42-5. The supply voltage VCC (e.g., 5 volts) is connected to another input terminal of the NAND gate 42-5. An output terminal of the NAND gate 42-5 is connected to an input terminal of an inverter gate 43-5. The inverter gate 43-5 outputs a signal /a2'.

The internal address signal a2 is inputted to one input terminal of a NAND gate 42-6. The supply voltage VCC is connected to another input terminal of the NAND gate 42-6. An output terminal of the NAND gate 42-6 is connected to an input terminal of an inverter gate 43-6. The inverter gate 43-6 outputs a signal a2'.

The signals (i.e., /a0/a1, a0/a1, /a0a1, a0a1, /a2',and a2') produced from the row pre-decoder 7 are transferred to the row decoder 9.

Figure 6:
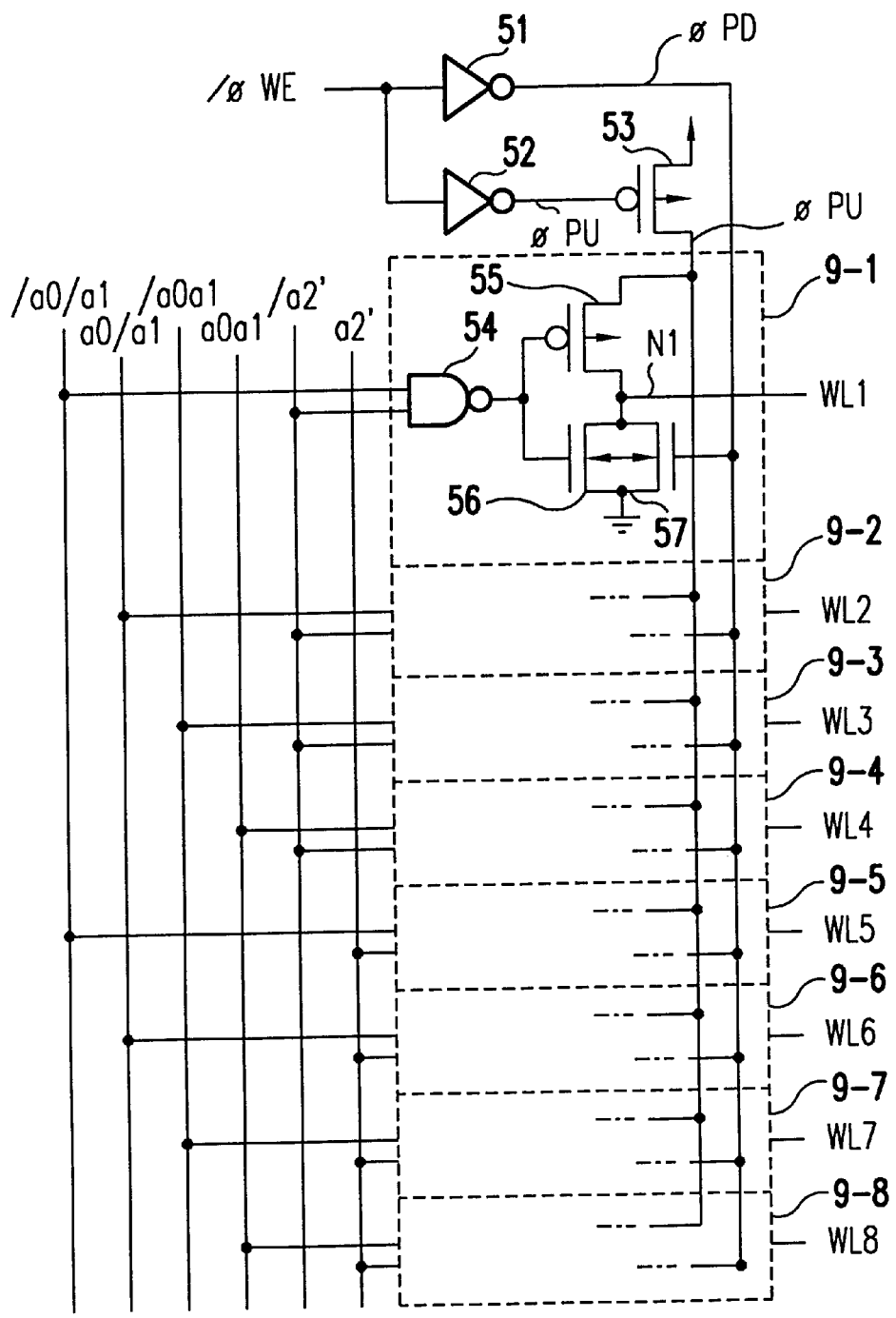
FIG. 6 is a circuit diagram showing a row decoder according to a first preferred embodiment of the present invention.

FIG. 6 is a circuit diagram showing the row decoder 9 according to the first preferred embodiment of the present invention.

As shown in FIG. 6, the row decoder 9 mainly includes sub row decoders 9-1, 9-2, 9-3, 9-4, 9-5, 9-6, 9-7, 9-8, inverter gates 51, 52, and a PMOS 53 as a first voltage signal supply element. Since the structures of the sub row decoders 9-1 through 9-8 are identical to each other, the structures of the sub row decoders 9-2 through 9-8 are not shown in FIG. 6.

The write recovery signal /φWE output from the write recovery signal generate circuit 13 is applied to the inverter gate 51 and the inverter gate 52. The inverter gate 51 outputs a signal φPD according to the write recovery signal /φWE. The inverter gate 52 outputs a signal φPU according to the write recovery signal /φWE.

The signal φPD is applied to the row decoder 9-1 through 9-8. The signal φPU is applied to a gate of the PMOS 53. The PMOS 53 has a source connected to the power supply voltage VCC and outputs a signal /φPU from a drain thereof in response to the signal φPU which is applied to the gate thereof.

Each of the sub row decoders 9-1 through 9-8 includes a NAND gate 54, a PMOS 55, an NMOS 56, and an NMOS 57 as a second voltage signal supply element. The circuit structures of the sub row decoders 9-1 through 9-8 are identical to each other.

In the sub row decoder 9-1, the signal /a0/a1 is applied to one input terminal of the NAND gate 54. The signal /a2' is applied to another input terminal of the NAND gate 54. An output terminal of the NAND gate 54 is connected to a gate of the PMOS 55 and a gate of the NMOS 56, wherein a pair of the PMOS 55 and the NMOS 56 functions as an inverter gate. A source of the PMOS 55 is connected to a drain of the PMOS 53. A drain of the PMOS 55 and a drain of an NMOS 57 are commonly connected to a node N1. A source of the NMOS 56 and a source of the NMOS 57 are connected to a ground voltage GND (i.e., a lower power supply voltage). A gate of the NMOS 57 is connected to an output terminal of the inverter gate 51. The node N1 serves as an output terminal of the sub row decoder 9-1 and is connected to the word line WL1.

The signal a0/a1 and the signal /a2' are applied to the sub row decoder 9-2. The signal /a0a1 and the signal /a2' are applied to the sub row decoder 9-3. The signal a0a1 and the signal /a2' are applied to the sub row decoder 9-4. The signal /a0/a1 and the signal a2' are applied to the sub-row decoder 9-5. The signal a0/a1 and the signal a2' are applied to the sub row decoder 9-6. The signal /a0a1 and the signal a2' are applied to the sub row decoder 9-7. The signal a0a1 and the signal a2' are applied to the sub row decoder 9-8.

Outputs of the sub row decoders 9-2 through 9-8 are connected to the word lines WL2 through WL8 respectively.

Next, an operation of the semiconductor memory device (SRAM 1) according to the first preferred embodiment of the present invention will be explained hereinafter with reference to FIG. 7.

Figure 7:
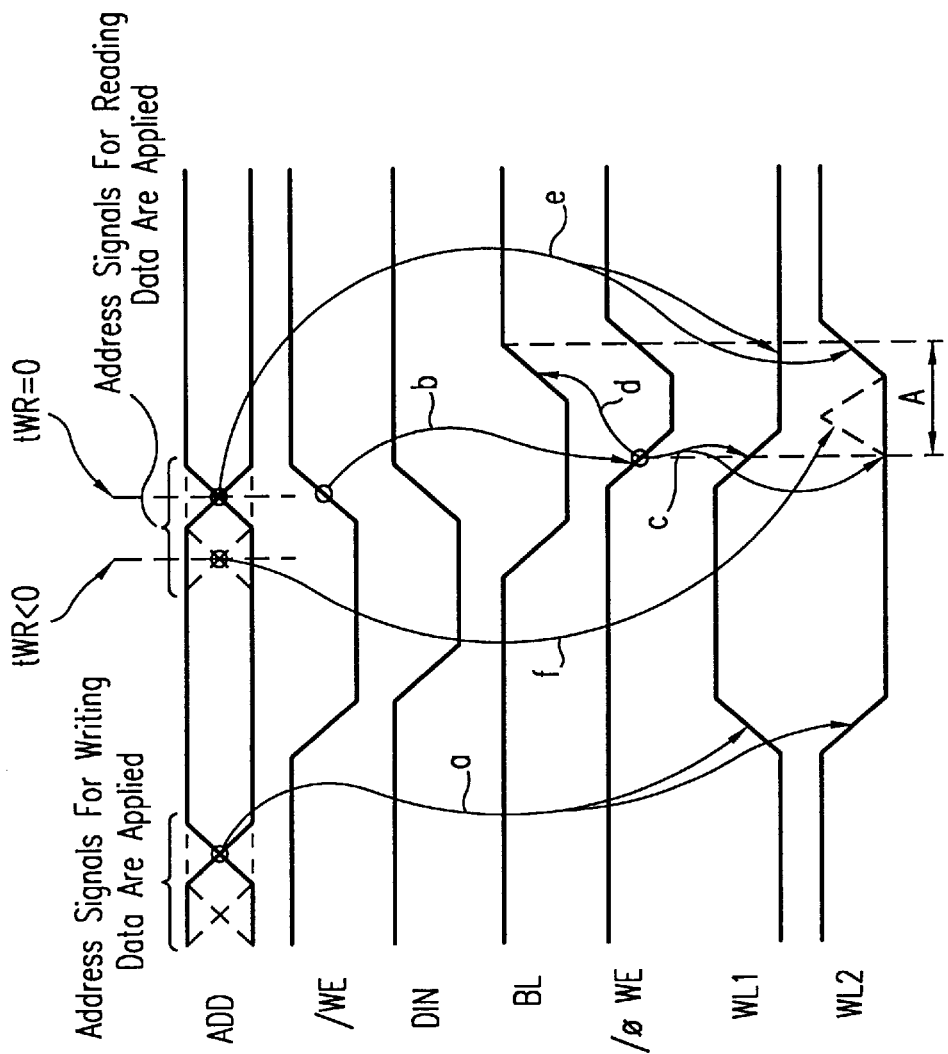
FIG. 7 is a timing chart showing an operation of a semiconductor memory device according to a first preferred embodiment of the present invention.

FIG. 7 is a timing chart showing an operation of the semiconductor memory device (SRAM 1) according to the first preferred embodiment of the present invention.

In FIG. 7, the solid line waveform of the address signals ADD indicates that the write recovery time period tWR equals 0. That is, a time when the address signals ADD change is substantially equal to a time when the write enable signal /WE goes to the H level.

On the other hand, the dotted line waveform of the address signals ADD indicates that the write recovery time period tWR is a negative. That is, a time when the address signals ADD change is earlier than a time when the write enable signal /WE goes to the H level.

In order to simplify explanations, the word line WL1 and the word line WL2 are shown in FIG. 7 as an example. The voltage levels of the word line WL1 and the word line WL2 are one of the examples.

(Case 1)

In the case that the write recovery time period tWR is 0.

First, since the write enable signal /WE is in the H level, the write recovery signal generate circuit 13 outputs the write recovery signal /φWE which is maintained at the H level. When the write recovery signal /φWE is in the H level, the signal φPU and the signal φPD are in the L level.

Since the signal φPD is in the L level, the NMOS 57 provided in each of the sub row decoders 9-1 through 9-8 is kept in an OFF state. Since the signal φPU is in the L level, the PMOS 53 enters an ON state and thus the signal φPU having the H level is applied to the PMOSs 55 provided in each of the sub row decoders 9-1 through 9-8.

The address signals A0, A1, A2 for writing data, i.e., the address signals ADD, are applied to the SRAM, that is, the address signals A0, A1, A2 are changed. Then the internal address signals (i.e., a0,/a0 through a2, /a2) obtained by the address signals A0, A1, A2 (i.e., the address signals ADD) select one of the sub row decoders 9-1 through 9-8 and make the PMOS 55 in the selected sub row decoder turn ON.

Therefore, the word line which corresponds to the selected sub row decoder goes to the H level (i.e., the word line is selected) and the other word lines go to the L level (i.e., the other word lines are not selected).

For example, the sub row decoder 9-1 is selected and thus the word line WL1 goes to the H level. The sub row decoders 9-2 through 9-8 are not selected and thus the word lines WL2 through WL8 go to the L level (refer to an arrow a).

At this time, the write enable signal /WE goes to the L level. This means that the write cycle begins. Furthermore, an input data DIN having the L level is applied to the input circuit (not shown). Therefore, the input data DIN is transferred to the bit line pair BL, /BL selected by the column select signals CD1, /CD1 through CDn, /CDn.

Accordingly, the input data DIN begins to be written into the memory cell C which is determined by the selected word line WL1 and the bit line pair BL, /BL selected by the column select signals CD1, /CD1 through CDn, /CDn.

Thereafter, the write enable signal /WE changes from the L level to the H level. (This means that the read cycle begins.)

The write recovery signal /φWE goes to the L level in response to the H level (more precisely, a rising edge) of the write enable signal /WE. (refer to an arrow b).

When the write recovery signal /φWE goes to the L level, the signal φPD goes to the H level and the signal /φPU goes to a floating level. The signal φPD having the H level makes the NMOS 57 in each of the sub row decoders 9-1 through 9-8 turn ON. Therefore, the word lines WL1 through WL8 go to the L levels (refer to arrows c).

The next address signals A0, A1, A2 (i.e., the address signals ADD) for reading data are applied to the SRAM, that is, the address signals A0, A1, A2 are changed, at a time when the write enable signal /WE goes to the H level. Thereafter, the internal address signals (i.e., a0, /a0 through a2, /a2) obtained by the address signals A0, A1, A2 (i.e., the address signals ADD) select one of the sub row decoders 9-1 through 9-8 and make the PMOS 55 in the selected sub row decoder turn ON after a predetermined time. In this case 1, the predetermined time occurs at substantially the same time when the write recovery signal /φWE goes to the H level.

The bit line pairs BL, /BL begin to be pre-charged to a pre-charge level (e.g. H level) in response to the L level (more precisely, the falling edge) of the write recovery signal /φWE (refer to an arrow d).

Thereafter, the write recovery signal /φWE changes from the L level to the H level. The NMOS 57 in each of the sub row decoders 9-1 through 9-8 turn OFF in response to the H level of the write recovery signal /φWE (i.e., the L level of the signal /φPD ). Furthermore, the signal /φPU goes to the H level again according to the H level of the write recovery signal /φWE.

Since the signal RU goes to the H level, one of the sub row decoders 9-1 through 9-8 selected by the address signals ADD for reading data outputs the H level to the corresponding word line.

That is, the word line which corresponds to the selected sub row decoder goes to the H level (i.e., the word line is selected) and the other word lines go to the L level (i.e., the other word lines are not selected).

In this embodiment, the sub row decoder 9-2 is selected and thus the word line WL2 goes to the H level. The sub row decoders 9-1, 9-3 through 9-8 are not selected and thus the word lines WL1, WL3 through WL8 go to the L level (refer to an arrow e).

After that, the data which is indicated by the address signals ADD for reading data is read out from the memory cell C.

As described above, the write recovery signal generate circuit 13 outputs the one shot pulsed write recovery signal /φWE having the L level. That is the write recovery signal /φWE is in the L level during a time period A as shown in FIG. 7. Therefore, the word lines WL1 through WL8 are set to the L levels by the one shot pulsed write recovery signal /φWE in this time period A.

(Case 2)

In the case that the write recovery time period tWR is a negative.

The case 2 is a situation where a time when the address signals ADD are applied to the SRAM (or it is called a time when the address signals ADD change) is earlier than a time when the write enable signal /WE goes to the H level.

In this case 2, a time when the sub row decoders 9-1 through 9-8 are selected is earlier than the case 1, because the address signals ADD for reading data is applied earlier than the case 1.

These address signals ADD are applied to the SRAM at a time before the write enable signal /WE goes to the H level. Thereafter, the internal address signals (i.e., a0, /a0 through a2, /a2) obtained by the address signals A0, A1, A2 (the address signals ADD) select one of the sub row decoders 9-1 through 9-8 and make the PMOS 55 in the selected sub row decoder turn ON after a predetermined time. In this case 2, the predetermined time occurs in the time period A.

In the time period A, when the sub row decoder 9-2 is selected, since the write recovery signal /φWE is in the L level, the word line WL2 is still maintained at the L level.

Thereafter, the write recovery signal /φWE changes from the L level to the H level. When the write recovery signal /φWE is the H level, the signal φPD goes to the L level. Therefore, all the NMOSs 57 enter the OFF state. Furthermore, since the signal φPU goes to the L level, the signal /φPU goes to the H level again. Therefore, the word line WL2 goes to the H level.

In the conventional semiconductor memory device, there is a possibility that the word line WL2 which corresponds to the selected sub row decoder 9-2 goes to the H level in the time period A (refer to an arrow f).

In the present invention, however, the word lines WL1, WL2 are set to the L level in the period A because of the one shot pulsed write recovery signal /φWE and the NMOSs 57 of the ON states. That is, all word lines are set to the L levels in the time period A.

As explained above, in the first preferred embodiment of the present invention, the write recovery signal /φWE controls the PMOS 53 and the NMOS 57 which are provided in the final output stage of the row decoder 9. (The final output stage means a stage which drives the word lines.)

Therefore, at substantially the same time that the write enable signal /WE goes to the H level, the word lines WL1 through WL8 may be driven to the L level. That is, the word lines WL1 through WL8 are inhibited from going to the H level (the H level is called activated level or selected level) during the time period A even if the case 2 is executed. (The time period A means a time period at the end of the write cycle in preparation for a succeeding read cycle.)

Consequently, the first preferred embodiment of the present invention may prevent the data, which has been just written into the memory cell C in the write cycle, from being written into the memory cell C selected by the address signals for reading data at the beginning of the read cycle.

A semiconductor memory device according to a second preferred embodiment of the present invention will be explained hereinafter. The difference between the second preferred embodiment and the first preferred embodiment resides in a row decoder.

Figure 8:
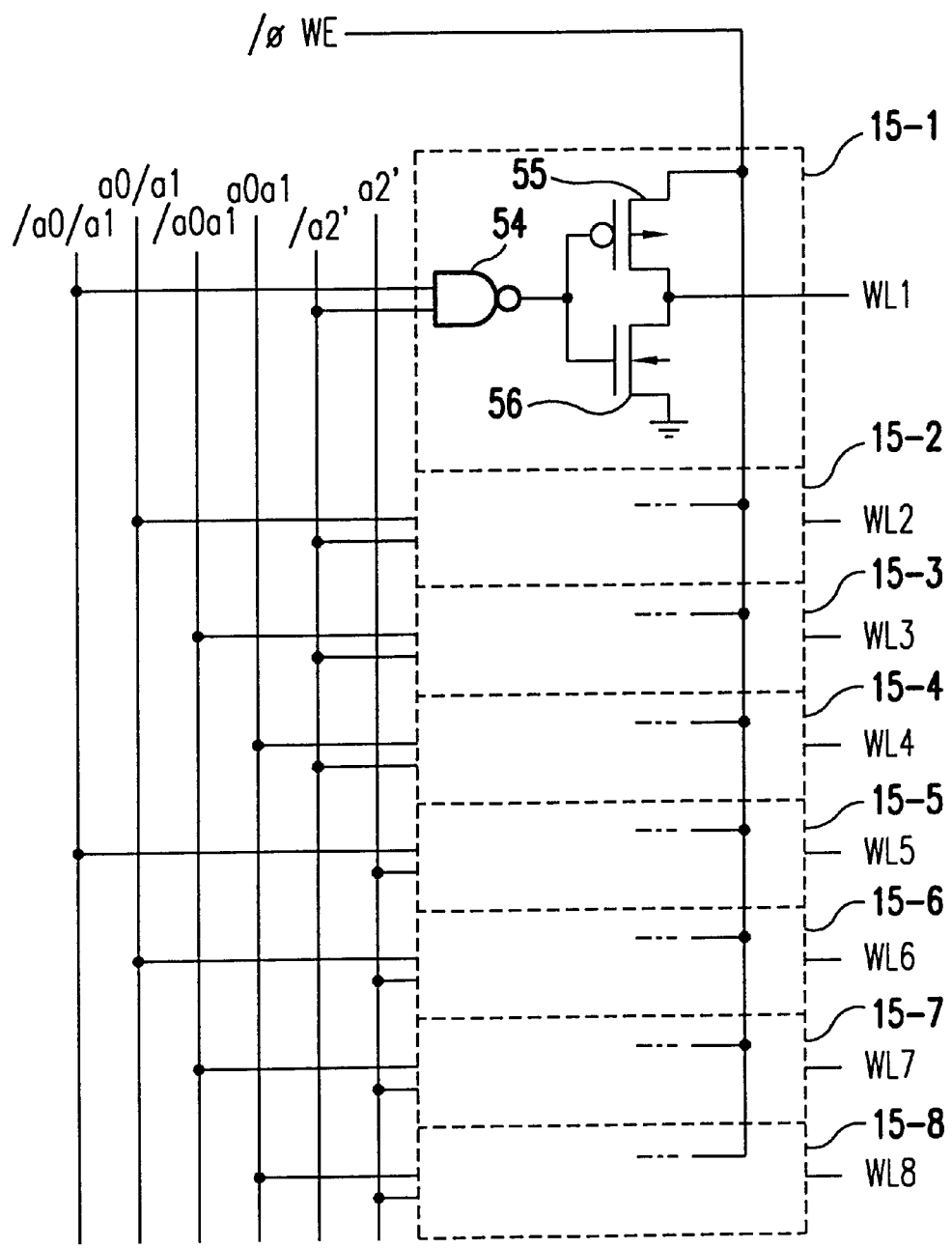
FIG. 8 is a circuit diagram showing a row decoder according to a second preferred embodiment of the present invention.

FIG. 8 is a circuit diagram showing a row decoder 15 according to the second preferred embodiment of the present invention.

The row decoder 15 has sub row decoders 15-1 through 15-8 which correspond to the sub row decoders 9-1 through 9-8, respectively, but does not have the inverter 51,52, and the PMOS 53. Furthermore, each of the sub row decoders 15-1 through 15-8 does not have any elements corresponding to the NMOS 57. That is, a circuit scale of the row decoder 15 is smaller than that of the row decoder 9.

The row decoder 15 may be used in a case described as follows.

In general, bit line pair pull up transistors are connected to one of the corresponding bit line pairs BL, /BL. The bit line pair pull up transistors supply the power supply voltage VCC to the corresponding bit line pair BL, /BL. There is a possibility that the bit line pairs BL, /BL do not go to the ground level GND (i.e., the L level) sufficiently when a data signal having the L level is applied to one of the bit lines BL, /BL because of the bit line pair pull Up transistors.

The second preferred embodiment is effective in such a case that the insufficient L level of the bit line pairs BL, /BL is greater than a threshold voltage Vtn of the NMOS 56 in the row decoder 9. The insufficient L level is explained as a voltage VL.

Next, an operation of the semiconductor memory device according to the second preferred embodiment of the present invention will be explained hereinafter with reference to FIG. 9.

Figure 9:
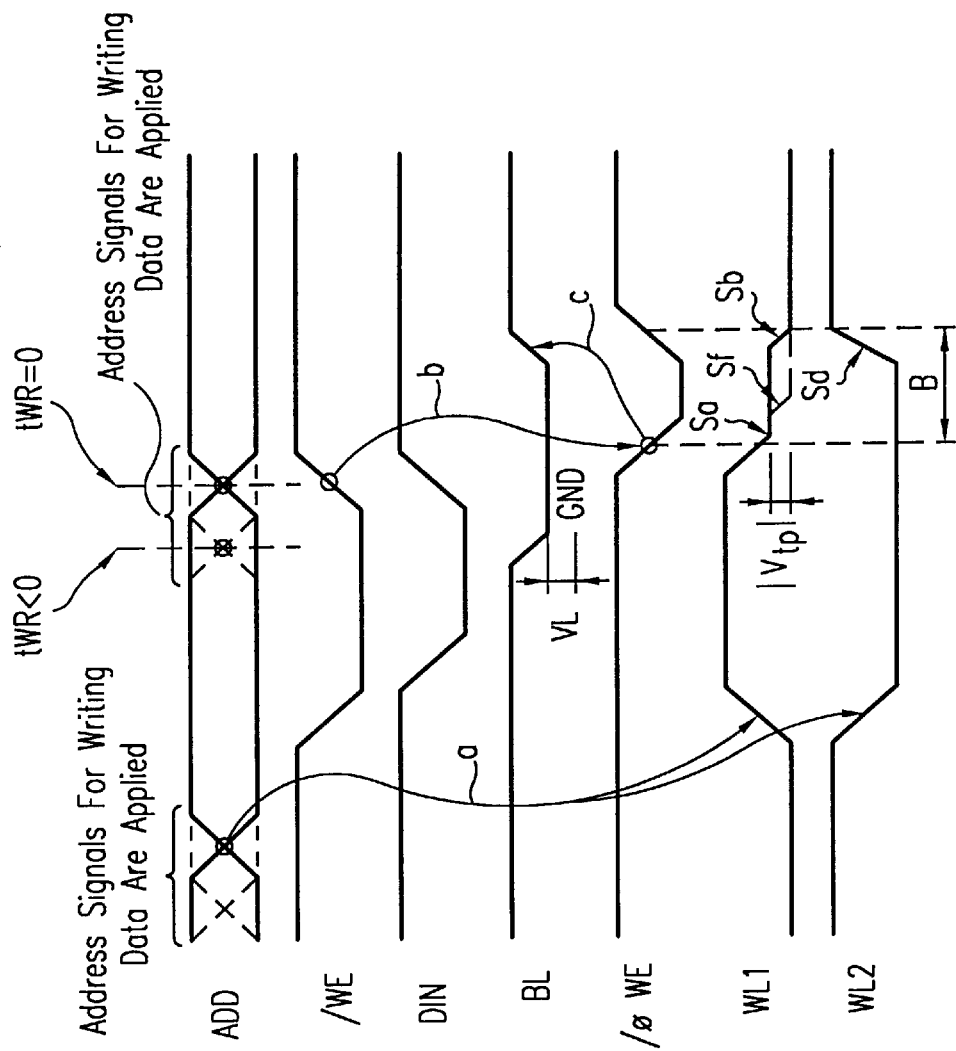
FIG. 9 is a timing chart showing an operation of a semiconductor memory device according to a second preferred embodiment of the present invention.

FIG. 9 is a timing chart showing an operation of the semiconductor memory device according to the second preferred embodiment of the present invention.

In FIG. 9, the solid line waveforms indicate that the write recovery time period tWR equals 0. That is, a time when the address signals ADD change is substantially equal to a time when the write enable signal /WE goes to the H level.

On the other hand, the dotted line waveforms indicate that the write recovery time period tWR is a negative. That is, a time when the address signals ADD change is earlier than a time when the write enable signal /WE goes to the H level.

In order to simplify explanations, the word line WL1 and the word line WL2 are shown in FIG. 9. The voltage levels of the word line WL1 and the word line WL2 are one of the examples.

(Case 1)

In the case that the write recovery time period tWR is 0.

First, since the write enable signal /WE is in the H level, the write recovery signal generate circuit 13 outputs the write recovery signal /φWE which is maintained at the H level. The write recovery signal /φWE having the H level is applied to sources of the PMOSs 55 provided in each of the sub row decoders 15-1 through 15-8.

The address signals A0, A1, A2 for writing data (i.e., the address signals ADD) are applied to the SRAM, that is, the address signals A0, A1, A2 are changed. Then the internal address signals (i.e., a0, /a0 through a2, /a2) obtained by the address signals A0, A1, A2 (i.e., the address signals ADD) select one of the sub row decoders 15-1 through 15-8 and make the PMOS 55 in the selected sub row decoder turn ON.

Therefore, the word line which corresponds to the selected sub row decoder goes to the H level (i.e., the word line is selected) and the other word lines go to the L level (i.e., the other word lines are not selected).

For example, the sub row decoder 15-1 is selected and thus the word line WL1 goes to the H level. The sub row decoders 15-2 through 15-8 are not selected and thus the word lines WL2 through WL8 go to the L level (refer to an arrow a).

At this time, the write enable signal /WE goes to the L level. Furthermore, an input data DIN having the L level is applied to the input circuit (not shown). Therefore, the input data DIN is transferred to the bit line pair BL, /BL selected by the column select signals CD1, /CD1 through CDn, /CDn.

Consequently, the input data DIN begins to be written into the memory cell C which is determined by the selected word line WL1 and the bit line pair BL, /BL selected by the column select signals CD1, /CD1 through CDn, /CDn.

Thereafter, the write enable signal /WE changes from the L level to the H level. The write recovery signal /φWE goes to the L level in response to the H level (more precisely, a rising edge ) of the write enable signal /WE (refer to an arrow b).

Furthermore, since the write recovery signal /φWE goes to the L level, the selected word line WL1 goes to the |Vtp| level. The |Vtp| level is a threshold voltage level of the PMOS 55 (refer to an arrow Sa).

On the other hand, the word line WL2 is still in the L level.

The next address signals A0, A1, A2 (i.e., the address signals ADD) for reading data are applied to the SRAM, that is, the address signals A0, A1, A2 are changed, at a time when the write enable signal /WE goes to the H level. Therefore the internal address signals (i.e., a0, /a0 through a2, /a2) obtained by the address signals A0, A1, A2 (i.e., the address signals ADD) select one of the sub row decoders 15-1 through 15-8 and make the PMOS 55 in the selected sub row decoder turn ON and make the NMOSs 56 in the non-selected sub row decoders turn ON after a predetermined time. In this case 1, the predetermined time occurs substantially the same time when the write recovery signal /φWE goes to the H level.

The bit line pairs BL, /BL begin to be pre-charged to a pre-charge level (e.g., H level) in response to the L level (more precisely, the falling edge) of the write recovery signal /φWE (refer to an arrow c).

Thereafter, the write recovery signal /φWE changes from the L level to the H level.

Since the write recovery signal /φWE goes to the H level, one of the sub row decoders 15-1 through 15-8 selected by the address signals ADD for reading data outputs the write recovery signal /φWE having the H level to a corresponding word line.

That is, the word line which corresponds to the selected sub row decoder goes to the H level (i.e., the word line is selected) and the other word lines go to the L level (i.e., the other word lines are not selected).

In this case, the sub row decoder 15-2 is selected and thus the word line WL2 goes to the H level (refer to an arrow Sd). The sub row decoders 15-1, 15-3 through 15-8 are not selected and thus the word lines WL1, WL3 through WL8 go to the L level (refer to an arrow Sb).

After that, the data which is indicated by the address signals ADD for reading data is read out from the memory cell C.

As described above, the write recovery signal generate circuit 13 outputs the one shot pulsed write recovery signal /φWE having the L level. That is, the write recovery signal /φWE is in the L level during a time period B as shown in FIG. 9. Therefore, the word lines WL1 through WL8 are set to an inactive level which is insufficient to activate a memory cell transistor in the time period B.

(Case 2)

In the case that the write recovery time period tWR is a negative.

The case 2 is a situation where a time when the address signals ADD are applied to the SRAM, that is, a time when the address signals ADD change, is earlier than a time when the write enable signal /WE goes to the H level.

In the case 2, a time when the sub row decoders 15-1 through 15-8 are selected is earlier than the case 1, because the address signals ADD for reading data is applied earlier than the case 1.

These address signals ADD are applied to the SRAM at a time before the write enable signal /WE goes to the H level. Thereafter, the internal address signals (i.e., a0, /a0 through a2, /a2) obtained by the address signals A0, A1, A2 (the address signals ADD) select one of the sub row decoders 15-1 through 15-8 after a predetermined time. In this case 2, the predetermined time occurs in the time period B.

In the time period B, the sub row decoder 15-2 is selected. Since the write recovery signal /φWE is in the L level, the word line WL2 is still maintained at the L level.

On the other hand, since the NAND gate 54 outputs the H level, the NMOS 56 in the sub row decoder 15-1 enters the ON state. Therefore, the word line WL1 goes to the L level (refer to an arrow sf).

Thereafter, the write recovery signal /φWE changes from the L level to the H level. Since the write recovery signal /φWE is the H level, the write recovery signal /φWE having the H level is transferred to the word line WL2 through the PMOS 55 in the sub row decoder 15-2.

The write recovery signal /φWE having the H level is not transferred to the word line WL1, because the PMOS 55 in the sub row decoder 15-1 is in the OFF state.

In the conventional semiconductor memory device, there is a possibility that the word line WL2 which corresponds to the selected sub row decoder 15-2 goes to the H level in the time period B.

In the present invention, the word line WL2 is set to the L level in the tine period B, because the write recovery signal /φWE is in the L level in this time period B.

Therefore, all word lines finally reach the L levels in the time period B.

As explained above, in the second preferred embodiment of the present invention, the write recovery signal /φWE itself is used as a signal for selecting or activating the word lines.

Therefore, at substantially the same time that the write enable signal /WE goes to the H level, the word lines WL1 through WL8 may be driven to the L level. That is, in both of the case 1 and the case 2, the word lines WL1 through WL8 are inhibited from going to the H level (the H level is called activated level or selected level) during the period B due to the changes of the address signals ADD. (The period B means a time period at the end of the write cycle in preparation for a succeeding read cycle.)

Consequently, the second preferred embodiment of the present invention may prevent the data, which has been just written into the memory cell C in the write cycle, from being written into the memory cell C selected by the address signals for reading data at the beginning of the read cycle.

Furthermore, the second preferred embodiment of the present invention may reduce a circuit area of the semiconductor memory device.

A semiconductor memory device according to a third preferred embodiment of the present invention will be explained hereinafter.

The difference between the third preferred embodiment and the first preferred embodiment resides in a write recovery signal generate circuit and a row decoder.

Figure 10:
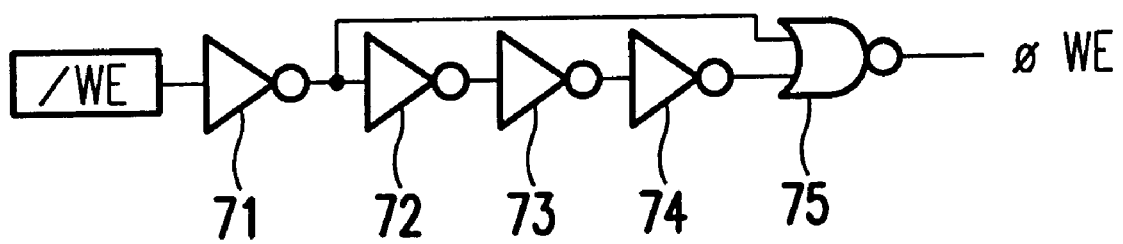
FIG. 10 is a circuit diagram showing a write recovery signal generate circuit according to a second preferred embodiment of the present invention.

FIG. 10 is a circuit diagram showing a write recovery signal generate circuit 63 according to the third preferred embodiment of the present invention.

The write recovery signal generate circuit 63 is made up of a NOR gate 75 and inverters 71, 72, 73, and 74 which are connected in series.

The NOR gate 75 has one input terminal which is connected to an output terminal of the inverter 74, another input terminal which is connected to an output terminal of the inverter 71, and an output terminal which outputs the write recovery signal /φWE.

The write recovery signal generate circuit 63 outputs the write recovery signal /φWE that has the H level in a predetermined time period (i.e., one shot pulsed signal) to the memory cell array 3 and the row decoder 69 in response to a rising edge of the write enable signal /WE.

Figure 11:
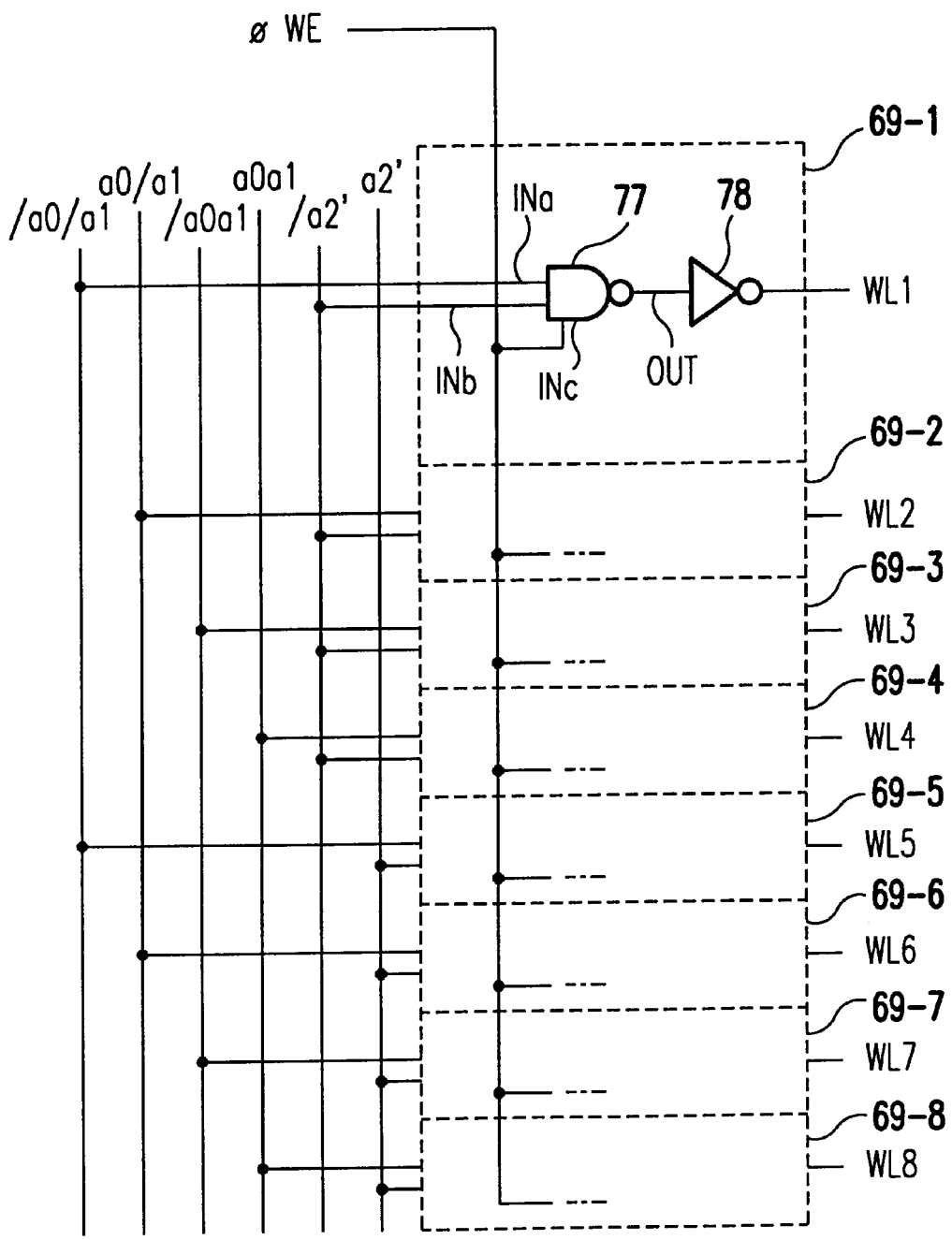
FIG. 11 is a circuit diagram showing a row decoder according to a third preferred embodiment of the present invention.

FIG. 11 is a circuit diagram showing the row decoder 69 according to the third preferred embodiment of the present invention.

As shown in FIG. 11, the row decoder 69 mainly includes sub row decoders 69-1, 69-2, 69-3, 69-4, 69-5, 69-6, 69-7, and 69-8. Since the structures of the sub row decoders 69-1 through 69-8 are identical to each other, the structures of the sub row decoders 69-2 through 69-8 are not shown in FIG. 11.

Each of the sub row decoders 69-1 through 69-8 includes a NAND gate 77 having a control terminal, and an inverter gate 78. The circuit structure of the sub row decoders 69-1 through 69-8 are identical to each other.

Figure 12:
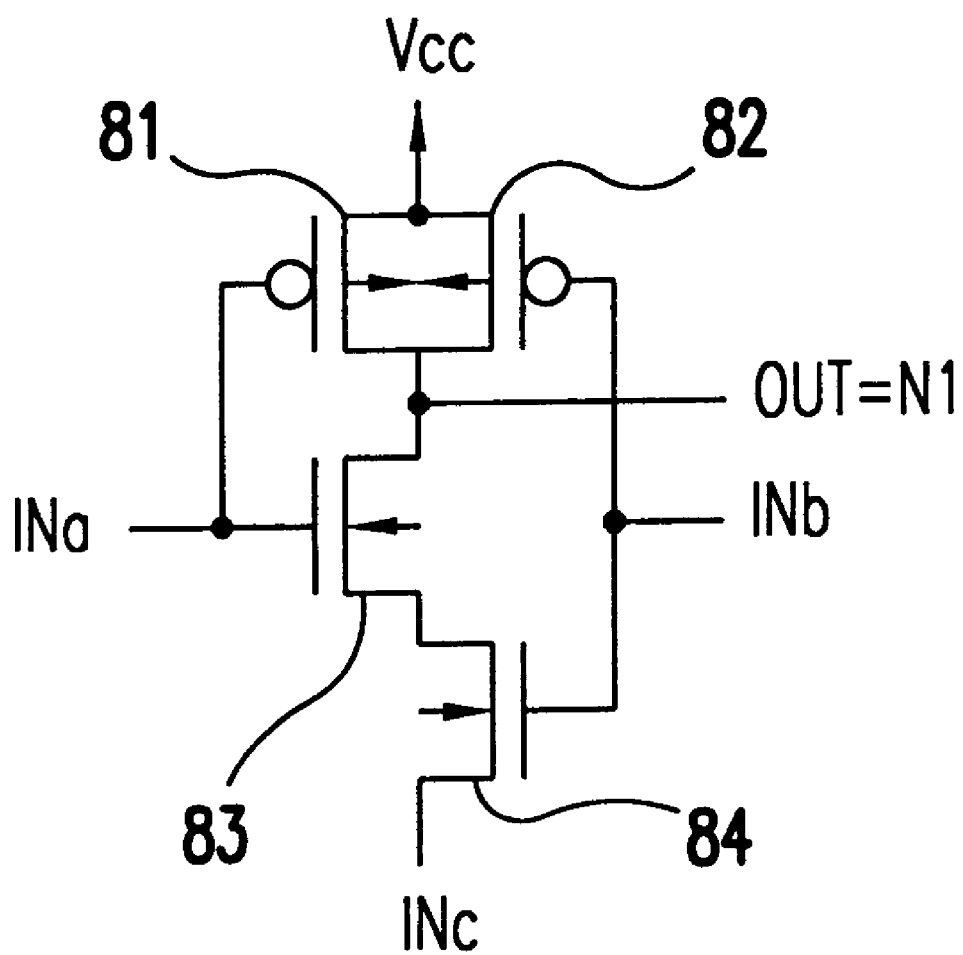
FIG. 12 is a circuit diagram showing a NAND gate 77.

FIG. 12 is a circuit diagram showing the NAND gate 77.

The NAND gate 77 has an input terminal INc as a control terminal, input terminals INa, INb for receiving address signals, and an output terminal OUT. The NAND gate 77 is made up of PMOSs 81,82 and NMOSs 83, 84. Sources of the PMOSs 81,82 are commonly connected to the power supply voltage VCC. Drains of the PMOSs 81,82 are connected to the output terminal OUT and a drain of the NMOS 83. A gate of the PMOS 81 is connected to the input terminal INa and a gate of the NMOS 83. A gate of the PMOS 82 is connected to the input terminal INb and a gate of the NMOS 84. A drain of the NMOS 84 is connected to a source of the NMOS 83. A source of the NMOS 84 is m connected to the input terminal INc.

In the sub row decoder 69-1, the signal /a0/a1 is applied to the input terminal INa of the NAND gate 77. The signal /a2' is applied to input terminal INb of the NAND gate 77. The output terminal of the NAND gate 77 is connected to an input terminal of the inverter gate 78. An output terminal of the inverter gate 78 is connected to the word line WL1. The input terminal INc of the NAND gate 77 is electrically coupled to the write recovery signal generate circuit 63 so as to receive the write recovery signal φWE.

The signal a0/a1 and the signal /a2' are applied to the sub row decoder 69-2. The signal /a0a1 and the signal /a2' are applied to the sub row decoder 69-3. The signal a0a1 and the signal a/a2' are applied to the sub row decoder 69-4. The signal /a0/a1 and the signal a2' are applied to the sub row decoder 69-5. The signal a0/a1 and the signal a2' are applied to the sub row decoder 69-6. The signal /a0a1 and the signal a2' are applied to the sub row decoder 69-7. The signal a0a1 and the signal a2' are applied to the sub row decoder 69-8.

Outputs of the sub row decoders 69-2 through 69-8 are connected to the word lines WL2 through WL8, respectively.

(Case 1)

In the case that the write recovery time period tWR is 0.

Figure 13:
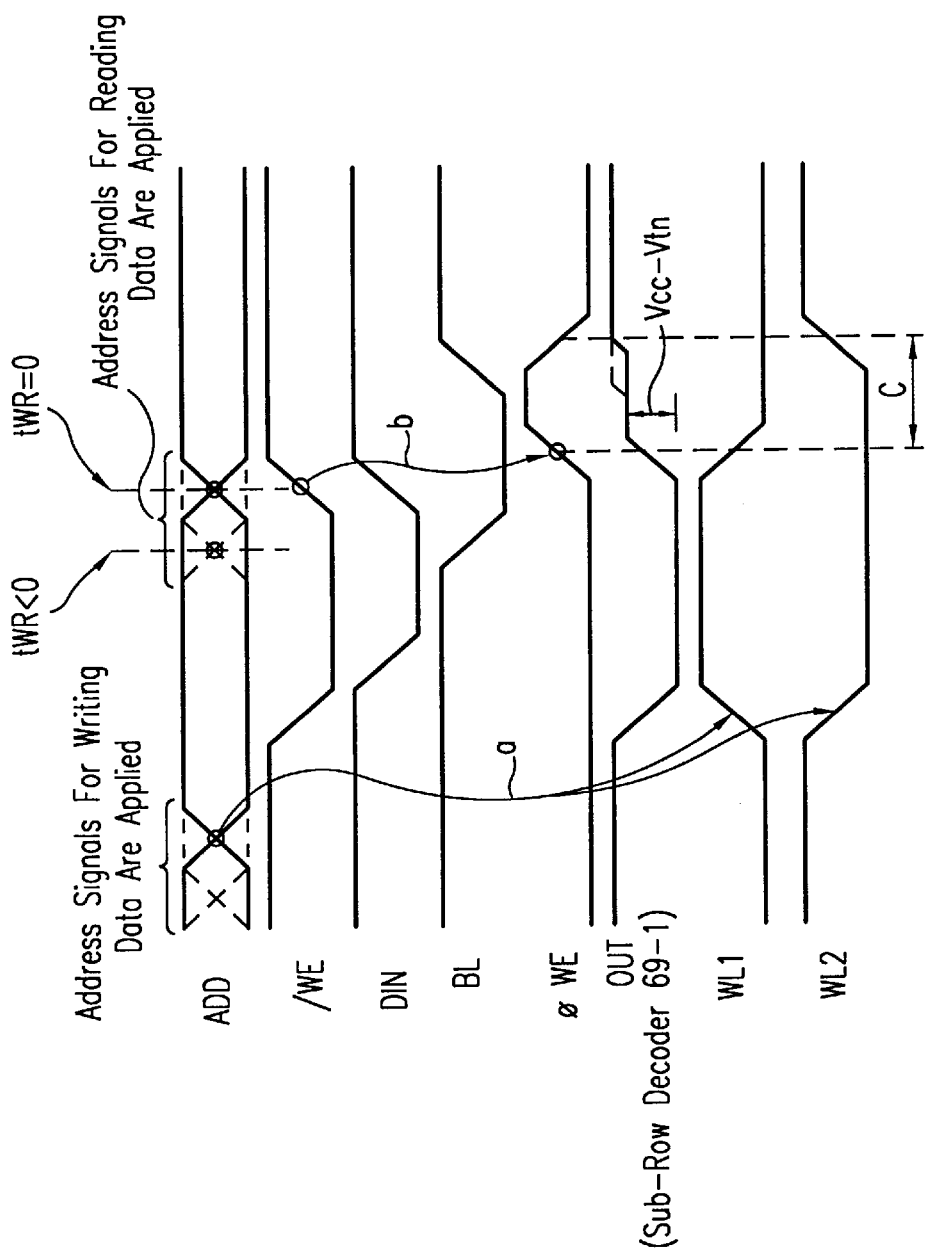
FIG. 13 is a timing chart showing an operation of a semiconductor memory device according to a third preferred embodiment of the present invention.

First, with reference to FIG. 13, since the write enable signal /WE is in the H level, the write recovery signal generate circuit 63 outputs the write recovery signal φWE which is maintained at the L level. The write recovery signal φWE having the L level is applied to the input terminals INc of the NAND gates 77.

Since the write recovery signal φWE is the L level, each of the NAND gates 77 functions as a normal NAND gate.

The address signals A0, A1, A2) for writing data (i.e., the address signals ADD) are applied to the SRAM, that is, the address signals A0, A1, A2 are changed. Then the internal address signals (i.e., a0, /a0 through a2, /a2) obtained by the address signals A0, A1, A2 (i.e., the address signals ADD) select one of the sub row decoders 69-1 through 69-8.

Therefore, the word line which corresponds to the selected sub row decoder goes to the H level (i.e., the word line is selected) and the other word lines go to the L level (i.e., the other word lines are not selected).

For example, the sub row decoder 69-1 is selected (the signal /a0/a1 and the signal /a2' go to the H level) and thus the word line WL1 goes to the H level. The sub row decoders 69-2 through 69-8 are not selected and thus the word lines WL2 through WL8 go to the L level (refer to an arrow a).

At this time, the write enable signal /WE goes to the L level. Furthermore, an input data DIN having the L level is applied to the input circuit (not shown). Therefore, the input data DIN is transferred to the bit line pair BL, /BL selected by the column select signals CD1, /CD1 through CDn, /CDn.

Accordingly, the input data DIN begins to be written into the memory cell C which is determined by the selected word line VWL1 and the bit line pair BL, /BL selected by the column select signals CD1, /CD1 through CDn, /CDn.

Thereafter, the write enable signal /WE changes from the L level to the H level. The write recovery signal φWE goes to the H level in response to the H level (more precisely, a rising edge ) of the write enable signal /WE (refer to an arrow b).

Each of the input terminals INc of the NAND gates 77 receives the write recovery signal q5E having the H level. Therefore, the output terminal OUT of the NAND gate 77 selected by the address signals ADD (i.e., the NAND gate 77 corresponding to the word line 1L1) goes to the |VCC-Vtn| level. The Vtn level is a threshold voltage of the NMOS 84. Since the |VCC-Vtn| level is higher than a threshold voltage level of the inverter gate 78, the word line WL1 is set to the L level.

On the other hand, since one of the NMOS 83 and NMOS 84 in the sub row decoder 69-2 is in the OFF state, the word line WL2 is still maintained at the L level.

The next address signals A0, A1, A2 (i.e., the address signals ADD) for reading data are applied to the SRAM, that is, the address signals A0, A1, A2 are changed, at a time when the write enable signal /WE goes to the H level. Therefore the internal address signals (i.e., a0, /a0 through a2, /a2) obtained by the address signals A0, A1, A2 (i.e., the address signals ADD) select one of the sub row decoders 69-1 through 69-8 after a predetermined time. In this case, the predetermined time occurs substantially the same time when the write recovery signal φWE goes to the L level.

The bit line pairs BL, /BL begin to be pre-charged to a pre-charge level (e.g., H level) in response to the H level (more precisely, the rising edge) of the write recovery signal φWE.

Thereafter, the write recovery signal φWE changes from the H level to the L level. Since the write recovery signal φWE goes to the L level, each of the NAND gates 77 functions as the normal NAND gate. Accordingly, the NAND gate 77 in the sub row decoder 69-2 outputs the L level to the inverter gate 78 and thus the word line WL2 goes to the H level.

On the other hand, since one of the PMOS 81 and the PMOS 82 in the sub row decoder 69-1 goes to the ON state, the output terminal OUT of the NAND gate 77 in the sub row decoder 69-1 changes from |VCC-Vtn| level to the VCC level. Consequently, the word line WL1 is still maintained at the L level.

The sub row decoders 69-3 through 69-8 are also not selected and thus the word lines WL3 through WL8 are still in the L level.

After that, the data which is indicated by the address signals ADD for reading data is read out from the memory cell C.

As described above, the write recovery signal generate circuit 63 outputs the one shot pulsed write recovery signal φWE having the H level. That is, the write recovery signal φWE is in the H level during a time period C as shown in FIG. 13. Therefore, the word lines WL1 through WL8 are set to the L levels by the one shot pulsed write recovery signal φWE in this period C.

(Case 2)

In the case that the write recovery time period tWR is a negative.

The case 2 is a situation where a time when the address signals ADD are applied to the SRAM, that is, a time when the address signals ADD change, is earlier than a time when the write enable signal /WE goes to the H level.

In the case 2, a time when the sub row decoders 69-1 through 69-8 are selected is earlier than the case 1, because the address signals ADD for reading data is applied earlier than the case 1.

These address signals A0, A1, A2 (i.e., the address signals ADD) for reading data are applied to the SRAM, that is, the address signals are changed, at a time before the write enable signal /WE goes to the H level. Therefore the internal address signals (i.e., a0, /a0 through a2, /a2) obtained by the address signals A0, A1, A2 (i.e., the address signals ADD) select one of the sub row decoders 69-1 through 69-8 after a predetermined time. In this case, the predetermined time occurs in the time period C.

In the time period C, when the sub row decoder 69-2 is selected, the output terminal OUT of the NAND gate 77 in the sub row decoder 69-2 goes to the |VCC-Vtn| level. Since the |VCC-Vtn| level is higher than a threshold voltage level of the inverter gate 78 in the sub row decoder 69-2, the word line WL2 is still maintained at the L level.

On the other hand, since one of the PMOS 81 and the PMOS 82 in the sub row decoder 69-1 goes to the ON state, the output terminal OUT of the NAND gate 77 in the sub row decoder 69-1 changes from |VCC-Vtn| level to the VOC level. However, the word line WL1 is also still maintained at the L level.

Thereafter, the write recovery signal φWE changes from the H level to the L level. Since the write recovery signal φWE is the L level, each of the NAND gates 77 functions as a normal NAND gate. Accordingly, the NAND gate 77 in the sub row decoder 69-2 outputs the H level to the inverter gate 78 and thus the word line WL2 goes to the L level.

The sub row decoders 69-3 through 69-8 are also not selected and thus the word lines WL3 through WL8 are still in the L level.

After that, the data which is indicated by the address signals ADD for reading data is read out from the memory cell C.

In the conventional semiconductor memory device, there is a possibility that the word line WL2 which corresponds to the selected sub row decoder 69-2 goes to the H level in the period C.

In the present invention, however, the word lines WL1, WL2 are set to the L level in the period C because of the one shot pulsed write recovery signal φWE. That is, all word lines are set to the L levels in the period C.

As explained above, in the third preferred embodiment of the present invention, the write recovery signal φWE controls the NAND gates 77 which are provided in the final output stage of the row decoder 9. (The final output stage means a stage which drives the word lines.)

Therefore, at substantially the same time that the write enable signal /WE goes to the H level, the word lines WL1 through WL8 may be driven to the L level. That is, in both of the case 1 and the case 2, the word lines WL1 through WL8 are inhibited from going to the H level (the H level is called activated level or selected level) during the period C even if the write recovery time period tWR is 0 or negative. (The period C means a time period at the end of the write cycle in preparation for a succeeding read cycle. Also the period C means a time period when a data exists on the bit line.)

Consequently, the third preferred embodiment of the present invention may prevent the data, which has been just written into the memory cell C in the write cycle, from being written into the memory cell C selected by the address signals for reading data at the beginning of the read cycle.

Furthermore, the third preferred embodiment of the present invention may reduce a circuit area of the semiconductor memory device.

While the preferred form of the present invention has been described, it is to be understood that modifications will be apparent to those skilled in the art without departing from the spirit of the invention. The scope of the invention is to be determined solely by the following claims.

What is claimed is:

1. A semiconductor memory device comprising:
   a plurality of word lines;
   a plurality of bit lines;
   a plurality of memory cells, each of said memory cells being coupled to a corresponding one of said word lines and being coupled to a corresponding one of said bit lines;
   a first node supplied with a first voltage level;
   a second node supplied with a second voltage level;
   a third node;
   a plurality of decoders, each of which is coupled among said second node, said third node, and a corresponding one of said word lines, and each of which selectively couples either one of said second node and said third node to said corresponding word line in response to an address signal;
   a write recovery signal generating circuit that generates a write recovery signal having an inactive state during a first time period at a beginning of a data write cycle, an active state during a second time period at an end of the data write cycle, and the inactive state during a third time period just after the second time period;
   a first voltage signal supply circuit, coupled to said first node and said third node, that couples said first node to said third node in response to the write recovery signal having the inactive state; and
   a second voltage signal supply circuit, coupled to said second node and said word lines, that couples said second node to said word lines according to the write recovery signal having the active state.

2. A semiconductor memory device as set forth in claim 1, wherein the voltage level is a logic high and the second voltage level is a logic low.

3. A semiconductor memory device as set forth in claim 1, wherein said first voltage signal supply circuit includes a transistor which has a first terminal coupled to said first node, a second terminal coupled to said third node, and a control terminal receiving the write recovery signal.

4. A semiconductor memory device as set forth in claim 3, wherein the transistor of said first voltage signal supply circuit is a PMOS transistor.

5. A semiconductor memory device as set forth in claim 1, wherein said second voltage signal supply circuit includes a plurality of transistors, each of which has a first terminal coupled to said second node, a second terminal coupled to said corresponding word line, and a control terminal receiving the write recovery signal.

6. A semiconductor memory device as set forth in claim 5, wherein the transistors of said second voltage signal supply circuit are NMOS transistors.

7. A semiconductor memory device comprising:
   a plurality of word lines;
   a plurality of bit lines;
   a plurality of memory cells, each of said memory cells being coupled to a corresponding one of said word lines and being coupled to a corresponding one of said bit lines;
   a first node supplied with a first voltage level;
   a second node;
   a plurality of decoders, each of which is coupled among said first node, said second node, and a corresponding one of said word lines, and each of which selectively couples either one of said first node and said second node to said corresponding word line in response to an address signal; and
   a write recovery signal generating circuit, coupled to said second node, that outputs a write recovery signal to said second node, the write recovery signal having an active state during a first time period at a beginning of a data write cycle, an inactive state during a second time period at an end of the data write cycle and the active state during a third time period just after the second time period.

8. A semiconductor memory device as set forth in claim 7, wherein each of said decoders comprises a PMOS transistor and an NMOS transistor, wherein the PMOS transistor has a first terminal coupled to said second node, a second terminal coupled to said corresponding word line, and a control terminal receiving the address signal, and wherein the NMOS transistor has a first terminal coupled to said corresponding word line, a second terminal coupled to said first node, and a control terminal receiving the address signal.

9. A semiconductor memory device as set forth in claim 7, wherein each of said decoders includes a PMOS transistor and an NMOS transistor, wherein the PMOS transistor has a first terminal coupled to said first node, a second terminal coupled to said corresponding word line, and a control terminal receiving the address signal, and wherein the NMOS transistor has a first terminal coupled to said corresponding word line, a second terminal coupled to said second node, and a control terminal receiving the address signal.

10. A semiconductor memory device comprising:

a plurality of word lines;

a plurality of bit lines;

a plurality of memory cells, each of said memory cells being coupled to a corresponding one of said word lines and being coupled to a corresponding one of said bit lines;

a first node supplied with a first voltage level;

a second node;

a plurality of decoders each including a logic gate, wherein each of said logic gates is coupled among said first node, said second node, and a corresponding one of said word lines, and wherein each of said logic gates selectively couples either one of said first node and said second node to said corresponding word line in response to an address signal; and a write recovery signal generating circuit, coupled to said second node, that outputs a write recovery signal to said second node, the write recovery signal having an active state during a first time period at a beginning of a data write cycle, an inactive state during a second time period at an end of the data write cycle and the inactive state during a third time period just after the second time period.

11. A semiconductor memory device as set forth in claim 10, wherein the logic gate comprises a NAND gate.

* * * * *